(12) United States Patent
Choi et al.

(10) Patent No.: US 11,268,191 B2
(45) Date of Patent: Mar. 8, 2022

(54) ATOMIC LAYER POLISHING METHOD AND DEVICE THEREFOR

(71) Applicant: KOREA INSTITUTE OF FUSION ENERGY, Daejeon (KR)

(72) Inventors: Yong Sup Choi, Gunsan (KR); Kang Il Lee, Gunsan (KR); Dong Chan Seok, Gunsan (KR); Soo Ouk Jang, Sejong (KR); Jong Sik Kim, Gunsan (KR); Seung Ryul Yoo, Daejeon (KR)

(73) Assignee: KOREA INSTITUTE OF FUSION ENERGY, Daejeon (KR)

( * ) Notice: Subject to any disclaimer, the term of this patent is extended or adjusted under 35 U.S.C. 154(b) by 0 days.

(21) Appl. No.: 16/644,440

(22) PCT Filed: Nov. 1, 2018

(86) PCT No.: PCT/KR2018/013178
§ 371 (c)(1),
(2) Date: Mar. 4, 2020

(87) PCT Pub. No.: WO2019/088731
PCT Pub. Date: May 9, 2019

(65) Prior Publication Data
US 2020/0216954 A1    Jul. 9, 2020

(30) Foreign Application Priority Data

Nov. 1, 2017 (KR) .......................... 10-2017-0144433

(51) Int. Cl.
*H01L 21/3065*    (2006.01)
*H01L 21/311*    (2006.01)
(Continued)

(52) U.S. Cl.
CPC .. *C23C 16/45536* (2013.01); *C23C 16/45544* (2013.01); *C23C 16/56* (2013.01); *H01J 37/32357* (2013.01); *H01J 2237/335* (2013.01)

(58) Field of Classification Search
None
See application file for complete search history.

(56) References Cited

U.S. PATENT DOCUMENTS 4,962,057 A * 10/1990 Epler .................... H01L 21/268
117/103
10,096,487 B2 * 10/2018 Yang ................. H01J 37/32192
(Continued)

FOREIGN PATENT DOCUMENTS

JP    H05-275402    10/1993
JP    2002329690    11/2002
(Continued)

OTHER PUBLICATIONS

International Search Report and Written Opinion issued in counterpart International Patent Application No. PCT/KR2018/013178, dated Feb. 1, 2019.

*Primary Examiner* — Shamim Ahmed
(74) *Attorney, Agent, or Firm* — Norton Rose Fulbright US LLP

(57) ABSTRACT

An atomic layer polishing method is described. The method includes: scanning the surface of a specimen to measure a peak site on the specimen surface; spraying toward the measured peak site a gas containing an element capable of binding to a first atom, which is an ingredient of the material of the specimen to form a first reaction gas layer in which the first reaction gas binds to the first atom on the surface of the peak; and projecting ions of inert gas to the peak site on which the first reaction gas layer is deposited to separate the first atom bound to the first reaction gas from the specimen.

16 Claims, 9 Drawing Sheets

(51) Int. Cl.
　　　*C23C 16/455*　　(2006.01)
　　　*C23C 16/56*　　(2006.01)
　　　*H01J 37/32*　　(2006.01)

(56) References Cited

U.S. PATENT DOCUMENTS

| | | | |
|---|---|---|---|
| 2002/0177321 A1* | 11/2002 | Li | H01L 21/3065 |
| | | | 438/710 |
| 2017/0069462 A1* | 3/2017 | Kanarik | H01L 21/3105 |
| 2018/0163312 A1* | 6/2018 | Blomberg | C23F 4/02 |

FOREIGN PATENT DOCUMENTS

| | | |
|---|---|---|
| JP | 2003-318156 | 11/2003 |
| JP | 4192112 | 12/2008 |
| JP | 5139092 | 2/2013 |
| JP | 2014-024702 | 2/2014 |
| JP | 2014-522104 | 8/2014 |
| JP | 6130313 | 5/2017 |
| JP | 2017157836 | 9/2017 |
| KR | 2017-0022922 | 3/2017 |

\* cited by examiner

[FIG. 1A]
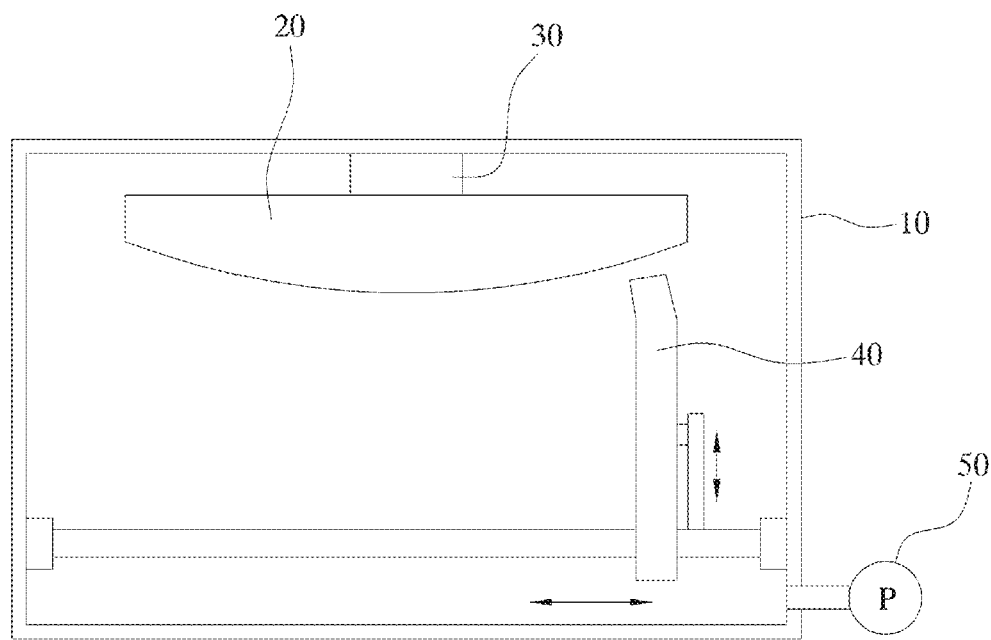

[FIG. 1B]
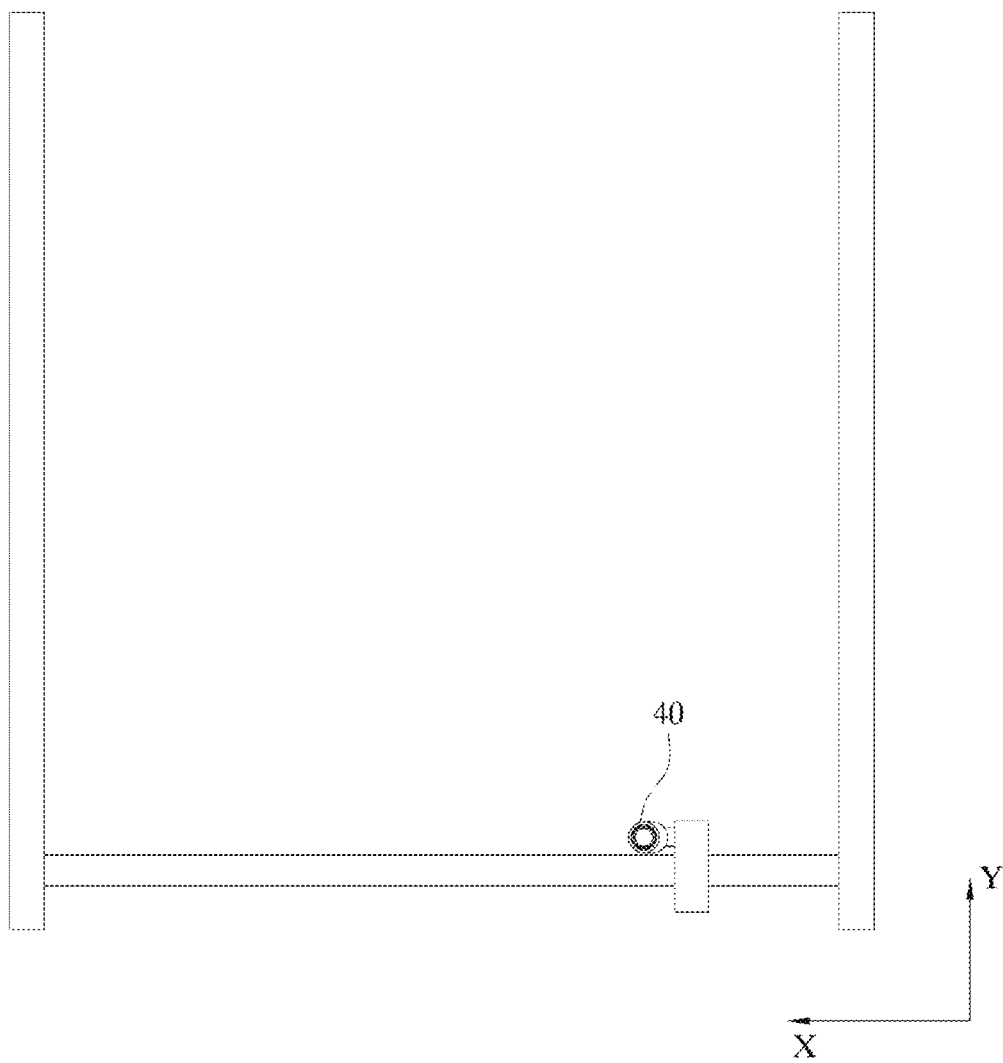

[FIG. 2]
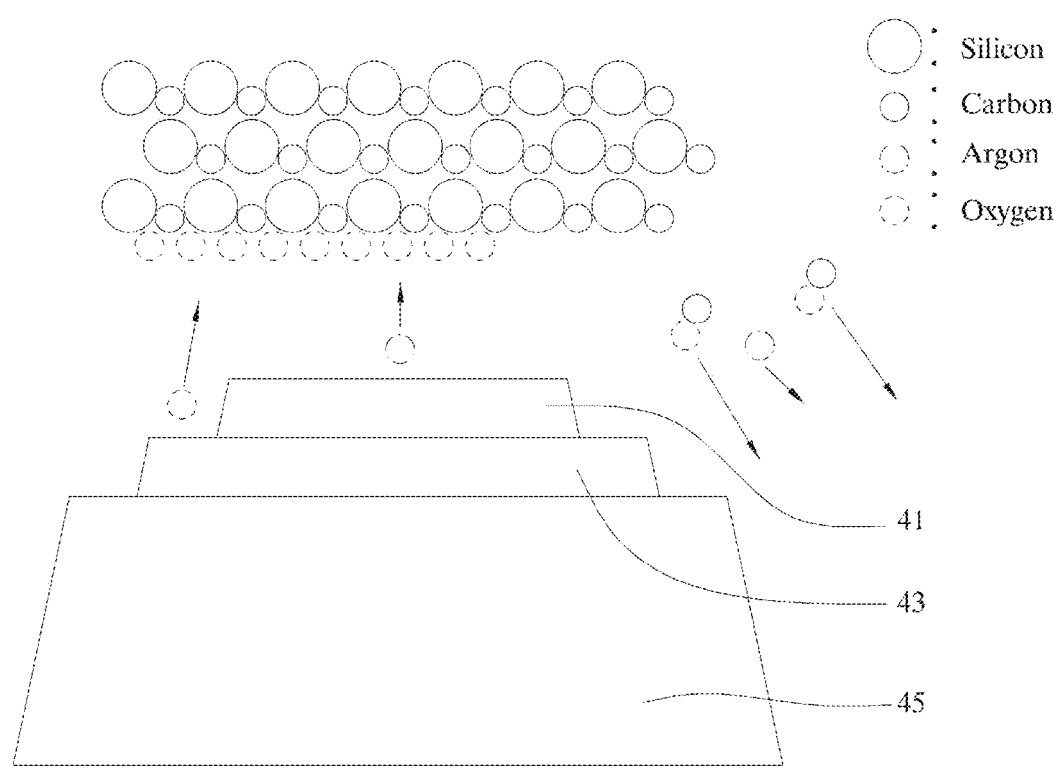

[FIG. 3]
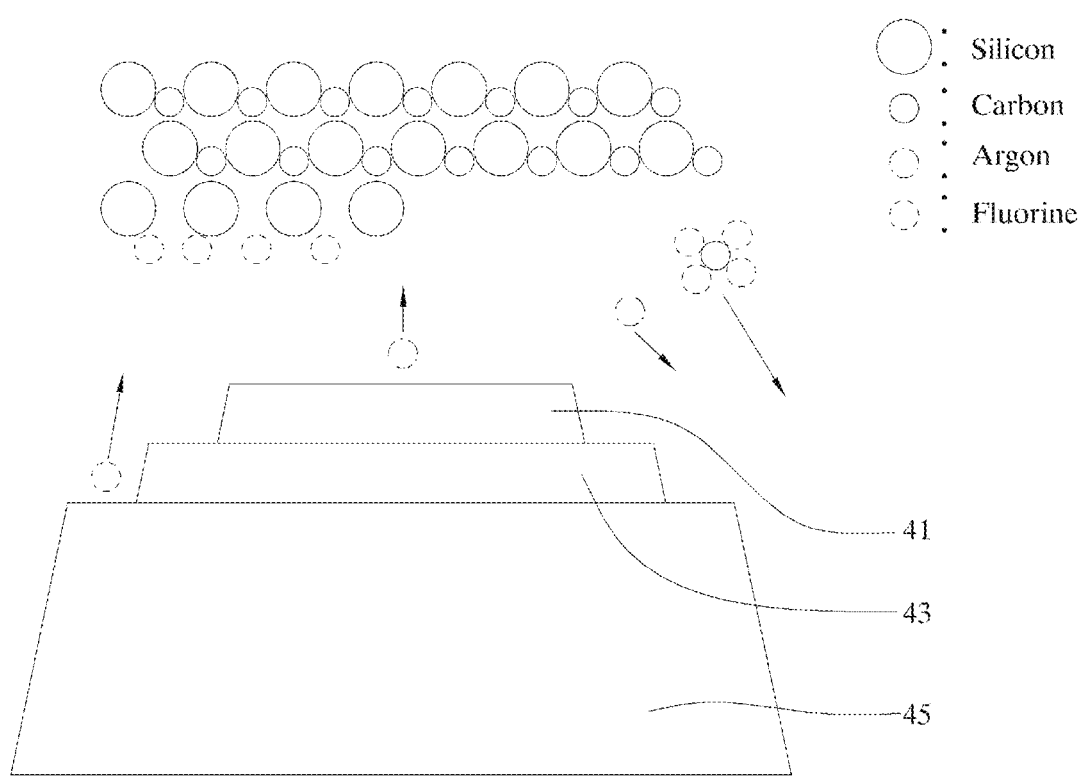

[FIG. 4]
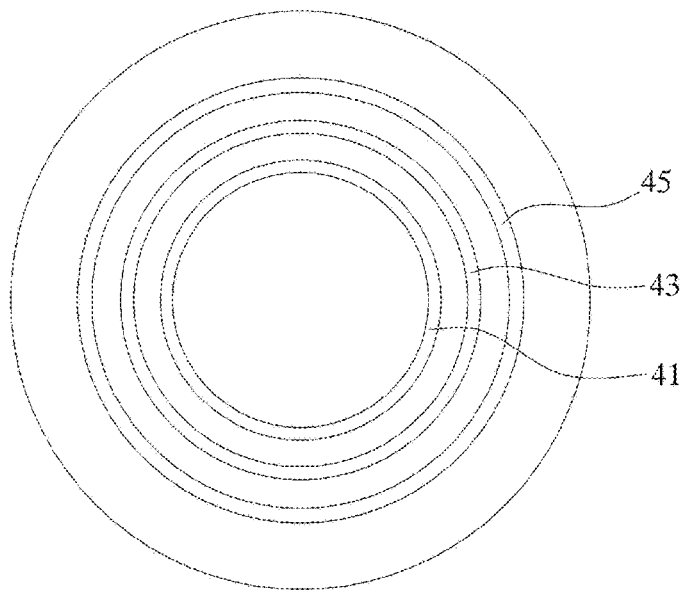
[FIG. 5]
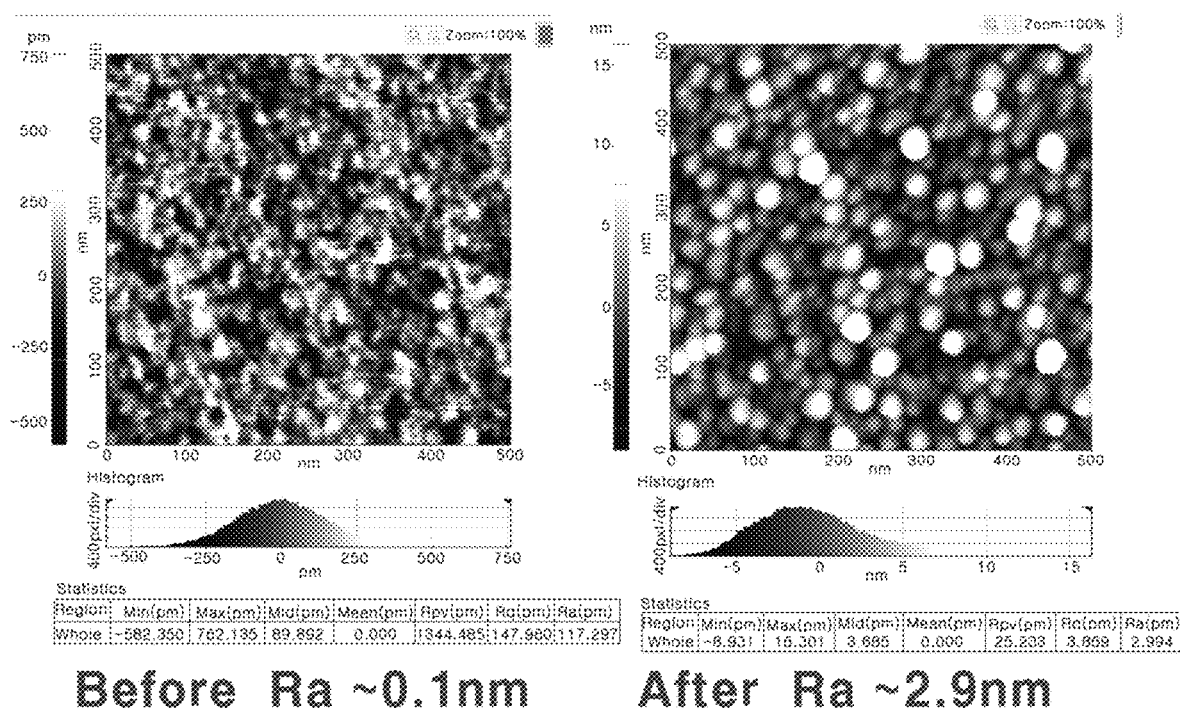
Before Ra ~0.1nm      After Ra ~2.9nm

[FIG. 6]
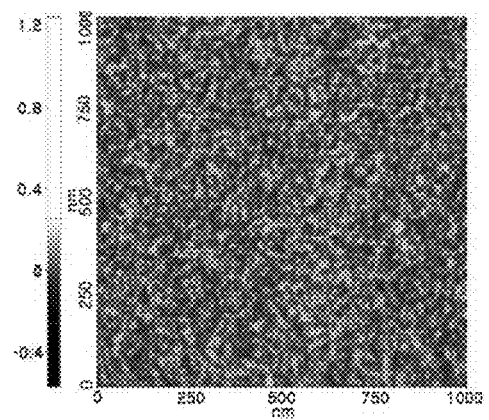 Before Ra ~0.1nm
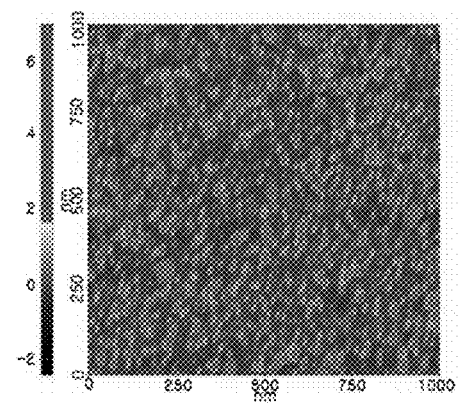 After Ra ~0.6nm
[FIG. 7]
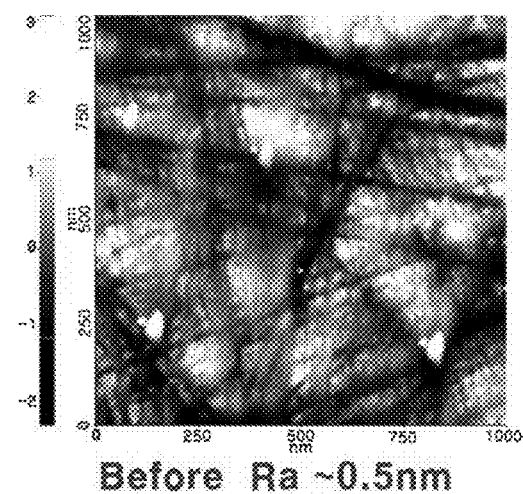 Before Ra ~0.5nm
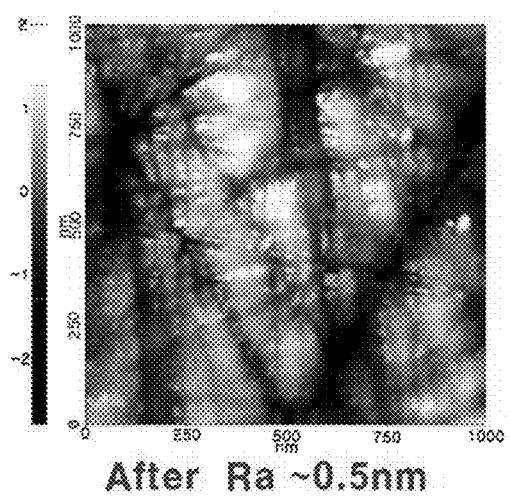 After Ra ~0.5nm

[FIG. 8]
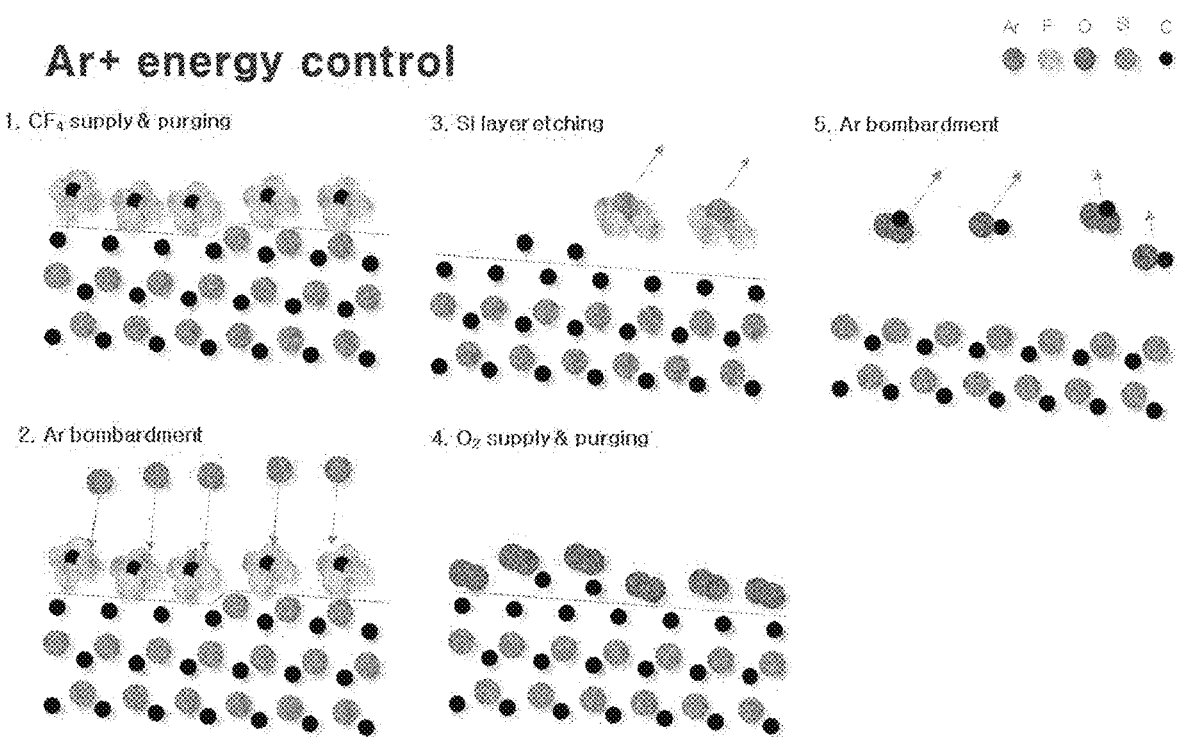

[FIG. 9]
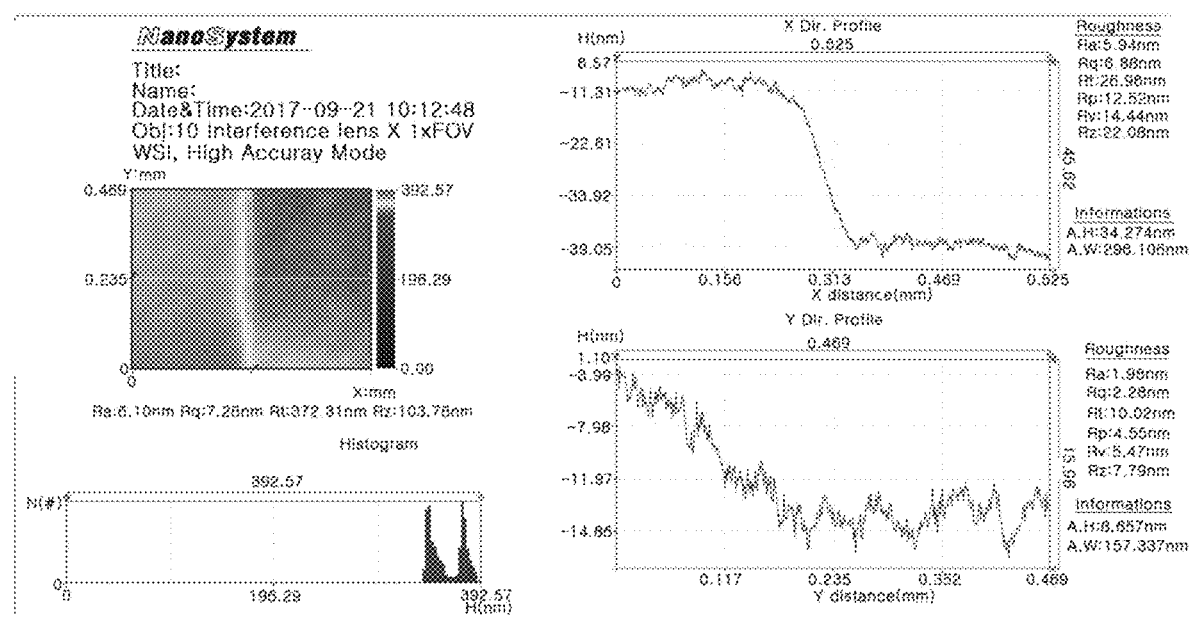

[FIG. 10]
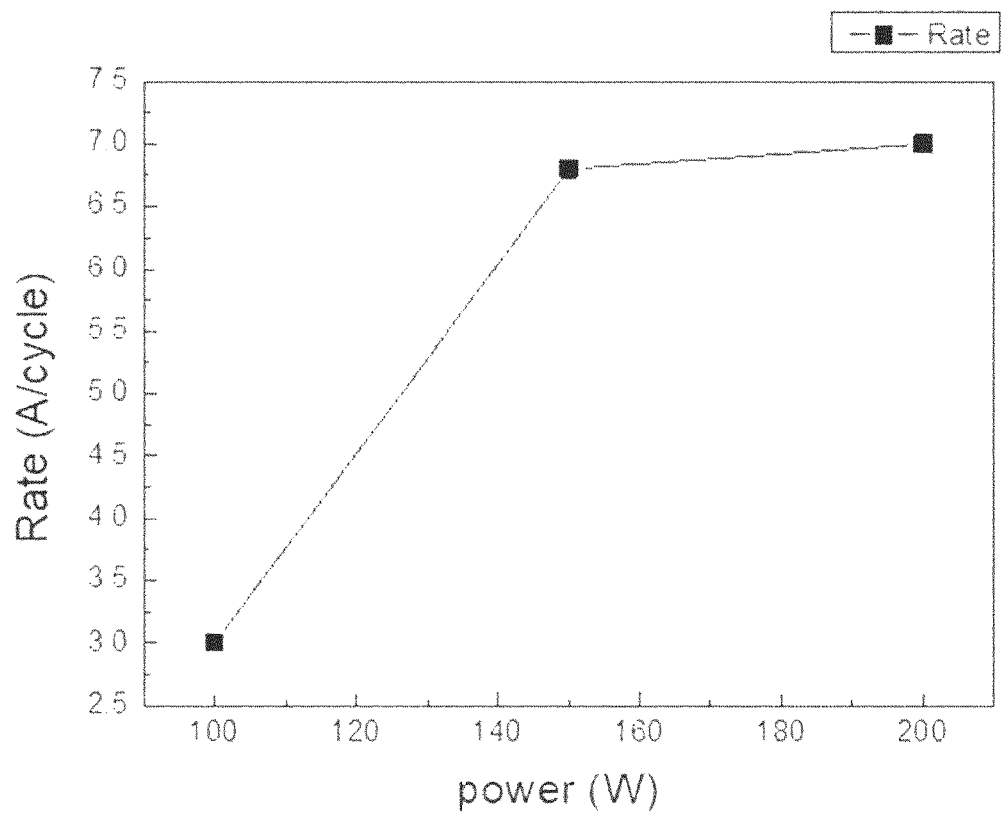

ATOMIC LAYER POLISHING METHOD AND DEVICE THEREFOR

CROSS-REFERENCE TO RELATED APPLICATIONS

This application is a national phase under 35 U.S.C. § 371 of International Application No. PCT/KR2018/013178, filed Nov. 1, 2018, which claims the benefit of priority to Korean Patent Application No. 10-2017-0144433, filed Nov. 1, 2017. The contents of the referenced patent applications are incorporated into the present application by reference.

TECHNICAL FIELD

The present disclosure relates to an atomic layer polishing system and an atomic layer polishing method, and more particularly, to a silicon carbide-based atomic layer polishing system and a silicon carbide-based atomic layer polishing method.

BACKGROUND ART

As imaging at a high resolution is required in a space camera, precise planarization of a lens is required. In particular, polishing a target in an atomic layer unit is required.

However, conventional polishing techniques employ physical and chemical polishing means. Current polishing apparatuses, for example, ion beam figuring apparatuses use sputtering due to physical collision and thus may not polish a target in an atomic layer unit.

In particular, it may be difficult to polish a material such as silicon carbide which is spotlighted as a material for a space optical lens because of its high hardness and chemical stability. For polishing of the silicon carbide, approaches for utilizing diamond particles in a polishing process based on particle sizes are used and CARE (catalyst surface referred etching) is used. However, these approaches are non-economical and do not achieve precise polishing of a target in an atomic layer unit.

Currently, there is no approach for polishing a surface of the lens in an atomic layer unit. Thus, a need for a lens for high resolution imaging is not satisfied. Therefore, there is a need for research of new approaches that meet the need for the lens for high resolution imaging.

DISCLOSURE

Technical Purposes

One purpose of the present disclosure is to provide a scheme for polishing a surface of a specimen in an atomic layer unit.

Another purpose of the present disclosure is to provide an atomic layer polishing system and an atomic layer polishing method by which even very hard materials such as silicon carbide may be polished in an atomic layer unit.

Technical Solutions

One aspect of the present disclosure provides an atomic layer polishing method comprising: scanning a surface of a specimen to determine a peak position of the specimen surface; spraying a first reactive gas toward the determined peak position such that a first reactive gas layer is formed in a surface of the peak, wherein the first reactive gas is capable of bonding to a first atom as a component of the specimen, wherein the first reactive gas bonds to the first atom to form the first reactive gas layer; and applying energy to the peak position where the first reactive gas layer is deposited, thereby separating the first atom bonded to the first reactive gas from the specimen.

As used herein, the term "polishing" means an operation of reducing a roughness of a surface of the specimen, and may be used for various purposes, for example, for purpose of planarization.

In one implementation, when the specimen contains two different elements, the first reactive gas has a higher bonding ability to the first atom than to other atoms than the first atom, wherein the method further comprises: after separating the first atom from the specimen, spraying a second reactive gas toward the determined peak position such that a second reactive gas layer is formed in a surface of the peak, wherein the second reactive gas is capable of bonding to a second atom as a component of the specimen, wherein the second reactive gas bonds to the second atom to form the second reactive gas layer, wherein the second reactive gas has a higher bonding ability to the second atom than to other atoms than the second atom; and applying energy to the peak position where the second reactive gas layer is deposited, thereby separating the second atom bonded to the second reactive gas from the specimen.

The specimen refers to a polishing target such as a lens, a mirror, or the like.

The peak refers to a value obtained in measurement of a polishing degree of a plane, and has a height larger than that at another position of the plane.

An atom as a component of the specimen includes a silicon atom or a carbon atom when the specimen is made of silicon carbide (SiC).

The term "the reaction gas capable of bonding to the atom" means that the reaction gas reacts with the atom to form a chemical bond. The carbon atom is easily bound to an oxygen atom when the former is exposed to the oxygen molecules or atoms, thereby to form an oxygen-carbon bond. Likewise, silicon is easily bonded to fluorine when the former is exposed to the fluorine-containing gas to form an silicon-fluorine bond.

The atom of the specimen bonded to the first reaction gas may be separated from the specimen by applying energy thereto. For example, applying the energy includes irradiating ions of an inert gas, or applying the energy includes irradiating electrons, or applying the energy includes irradiating light energy, or applying the energy includes irradiating neutral particles of an inert gas.

The first and second reactive gases bond to the first and second atoms, respectively to form a volatile gas. The first and second reaction gases may be separated and volatilized from the specimen when receiving the energy.

For example, the first and second reactive gases may acquire the energy via collision with the inert gas ions and thus may be separated from the specimen. The irradiation of the ions of the inert gas is carried out at an energy level controlled such that sputtering does not occur. In one example, the energy level is in a range of 1 to 100 eV. In one example, the inert gas is selected from argon, helium and xenon.

One atom bonded to the reaction gas is separated from the specimen. Thus, the specimen may be polished in an atomic layer unit.

In one embodiment, the method further comprises, after the formation of the first and/or second reactive gas layer, exhausting the chamber such that only the first and/or second reactive gas bonded to the first and/or second atoms of the specimen respectively remains. Thus, the polishing in an atomic layer unit may be improved.

In one implementation, the method further comprises repeating separation of the second atom from the first reactive gas layer to increase a smoothness of the surface of the specimen.

In one implementation, the method further comprises, between separating the first atom and forming the second reactive gas layer, removing the first reactive gas layer remaining on the specimen. In one implementation, the method further comprises: between separating the first atom and forming the second reactive gas layer, removing the first reactive gas layer remaining on the specimen; and between separating the second atom and forming the first reactive gas layer, removing the second reactive gas layer remaining on the specimen. Removing the first and/or second reactive gas layer includes irradiating plasma of a gas capable of reacting with the first and/or second reactive gas. The plasma may preferably be hydrogen plasma.

Another aspect of the present disclosure provides a silicon carbide planarization method using the atomic layer polishing method as defined above, wherein the specimen is made of silicon carbide, wherein the first reactive gas contains fluorine, wherein the second reactive gas contains oxygen. In one embodiment, the first reactive gas containing fluorine is first sprayed, and, then, the second reactive gas containing oxygen is sprayed. This is because the surface roughness may increase due to oxidation of exposed silicon of the surface when oxygen plasma treatment is first performed on the specimen made of silicon carbide.

Another aspect of the present disclosure provides an apparatus for performing the atomic layer polishing method as defined above, the apparatus comprises: a chamber for receiving a specimen therein; a pump configured to evacuate the chamber after formation of the first reactive gas layer, thereby to maintain an interior of the chamber in a vacuum state or to leave only the first reactive gas bonded to the first atom of the specimen; a specimen scanner for scanning a surface of the specimen to determine a peak position of the specimen surface; and a sprayer configured to spray the first reactive gas and the energy toward the surface of the specimen.

In one implementation, the sprayer includes an energy delivery nozzle and a reactive gas spray nozzle. The sprayer includes means for irradiating plasma of a gas capable of reacting with the first reactive gas toward the specimen, thereby to remove the first reactive gas layer remaining on the specimen. The sprayer is configured to be movable along a x-axis, a y-axis, and a z-axis to move toward the peak point, and the sprayer is configured to be inclined at a θ angle relative to a vertical direction.

Technical Effects

In accordance with the present disclosure, it is possible to precisely polish the surface of the very high hard and chemically stable specimen such as the silicon carbide in an atomic layer unit. Further, the surface of the specimen may be polished locally. Since the sprayer is freely movable, even a small sized sprayer may sufficiently polish a desired polishing target point. Further, a polishing target area may be controlled by controlling a diameter of plasma for spraying inert gas ions.

BRIEF DESCRIPTION OF DRAWINGS

FIG. 1A is a schematic diagram of a polishing system according to an embodiment of the present disclosure.

FIG. 1B illustrates an example where a sprayer shown in FIG. 1A moves along X and Y axes.

FIG. 2 is a schematic diagram of a sprayer in FIG. 1A according to an embodiment of the present disclosure.

FIG. 3 is a schematic diagram of a sprayer in FIG. 1A according to an embodiment of the present disclosure.

FIG. 4 shows a plane of the sprayer shown in FIG. 2 and FIG. 3.

FIG. 5 shows a results of atomic force microscopy measurement after etching of SiC using a method using gas containing oxygen as a first reactive gas and fluorine as a second reactive gas in accordance with Example 1.

FIG. 6 shows a result of atomic microscope measurement after etching of SiC using a method of using gas containing fluorine as a first reactive gas and oxygen as a second reactive gas in accordance with Example 2.

FIG. 7 shows a result of atomic force microscopy showing that a surface roughness of a localized portion is unchanged when plasma energy in Example 2 is adjusted in accordance with Example 3.

FIG. 8 is a schematic diagram illustrating atomic layer etching according to the present disclosure.

FIG. 9 shows a step occurring by 100 times etching under a condition that Example 3 is performed at 100 W.

FIG. 10 is a graph showing an etch rate per ALE cycle when plasma power is adjusted to 200 W, 150 W and 100 W in an atomic layer etching method.

DETAILED DESCRIPTIONS

Hereinafter, the terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", "including", "haves" and "having" when used in this specification, specify the presence of the stated features, integers, operations, elements, and/or components, but do not preclude the presence or addition of one or more other features, integers, operations, elements, components, and/or portions thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An atomic layer polishing system according to the present disclosure uses an atomic layer polishing apparatus. The atomic layer polishing system may remove one atomic layer from a surface at a target point to be polished, thereby to polish a polishing target point precisely. This approach is similar to ion beam figuring. However, the former removes atoms one layer by one layer, rather than physically removing the atoms, and thus enables more accurate and precise polishing.

FIG. 1A shows a partial schematic diagram of a polishing system according to an embodiment of the present disclosure. However, FIG. 1A is merely intended for illustrating the present disclosure, and the present disclosure is not limited to a configuration disclosed in FIG. 1A. Although some of components according to the present disclosure are not shown in FIG. 1A, omitted components are not necessarily optional additional components, but may be required components.

For this purpose, the polishing system according to an embodiment of the present disclosure includes a chamber 10, a specimen fixture 30 mounted in an upper space of the chamber 10 to fix the specimen 20, a specimen scanner installed in the chamber to scan a surface of the specimen to scan a smoothness of the surface of the specimen, a sprayer 40 installed in a lower space of the chamber and movable in three axes directions, and having a plurality of spray nozzles 41, 43 and 45 for spraying at least one reactive gas and inert gas ions toward the specimen, a gas supply connected to the sprayer, an inert gas ion supply connected to the sprayer, and a pump 50 communicating with the chamber to suck the gas inside the chamber, exhaust the gas to an outside, and maintain an inside of the chamber in a vacuum state.

A type of the specimen as the polishing target may be selected based on the appropriate selection of the reactive gas. A following embodiment according to the present disclosure will be described using an example where the specimen is made of silicon carbide. However, this is for illustrative purposes only, and the present disclosure is not necessarily limited to the silicon carbide specimen.

The polishing system includes the chamber. A shape or configuration of the chamber is not particularly limited. The chamber may be a conventional chamber used in the related art. However, the chamber is sealed from the outside such that the inside thereof is maintained at a vacuum state.

The specimen fixture is disposed on an inner face of a top of the chamber. The specimen fixture may be embodied as a jig that holds the specimen. However, the present disclosure may not be limited thereto.

The polishing system includes the specimen scanner for scanning the fixed specimen. The scanner is configured for inputting image information into a computer. For example, the scanner may image a scanning target one line by one line using a CCD camera, and may send the image information as a digital signal to the computer, and may scan the signal in an axial direction, and may receive plane image information. The specimen scanner transmits the digital information to a polishing controller which will be described later. Further, the image information may be measured in a range of several nanometers, allowing for very precise polishing.

The polishing controller receives smoothness data of the specimen from the specimen scanner and analyzes the data to derive a peak position, controls the sprayer to be described later based on the peak position such that the specimen is polished in a desired manner.

The polishing system includes the sprayer. The sprayer is installed on an inner face of a bottom of the chamber, and is movable in the three axis directions. The sprayer may have the plurality of spray nozzles to spray at least one reactive gas and inert gas ions toward the specimen.

FIG. 1B illustrates an example in which the sprayer shown in FIG. 1A moves along the X and Y axes directions.

In order to polish a polishing target point where polishing of the specimen is necessary, the sprayer is movable along at least one or more of the x-axis, y-axis, and z-axis shown in FIG. 1A and FIG. 1B, and may be tilted at an angle θ with respect to a vertical direction. The sprayer may receive a signal or data about the polishing target point from the polishing controller as described above and may move along at least one or more of the x-, y-, and z-axes directions based on the received data and may tilt at a θ angle with respect to the vertical direction. In particular, the sprayer may be precisely moved and positioned in a micrometer unit, and may be moved to the polishing target point very precisely.

Further, in an embodiment, FIG. 2 and FIG. 3 show schematic diagrams of some components of the sprayer and the specimen and the polishing process. FIG. 4 is a plan view of the sprayer shown in FIG. 2 and FIG. 3.

As shown in FIG. 2 to FIG. 4, the sprayer 40 may include a first reactive gas spray nozzle 43, a second reactive gas spray nozzle 45, and an inert gas ion spray nozzle 41. In this connection, in an example, the first reactive gas spray nozzle 43 is coaxial with the inert gas ion spray nozzle 41. A diameter of the first reactive gas spray nozzle 43 is greater than that of the inert gas ion spray nozzle 41. Further, the second reactive gas spray nozzle 45 is coaxial with the first reactive gas spray nozzle 43. A diameter of the second reactive gas spray nozzle 45 is larger than that of the first reactive gas spray nozzle 43.

FIG. 8 shows a schematic diagram illustrating atomic layer etching according to the present disclosure. The atomic layer etching will be described below with reference to FIG. 8.

Through the first reactive gas spray nozzle 43, the first reactive gas is sprayed toward the specimen. The first reactive gas may contain fluorine, such as $CF_4$, $SF_6$ or $NF_3$, and the second reactive gas may contain oxygen. FIG. 8 illustrates a fluorine-containing gas $CF_4$. When the fluorine-containing gas is sprayed toward the silicon carbide specimen, the fluorine-containing gas is deposited on the surface of the specimen. Thus, a reaction according to a following Reaction Formula 1 occurs.

$$SiC + SF_6 \rightarrow SiC\text{---}C + SiF_4$$    Reaction Formula 1

That is, one silicon atom of silicon carbide bonds with a fluorine atom and thus is separated from the silicon carbide via weak collision occurring such that sputtering by inert gas ions (Ar ions) does not occur. The silicon atom may be separated from the silicon carbide. That is, one atomic layer is removed.

Then, when oxygen is sprayed toward the silicon carbide specimen, the oxygen bonds with the carbon in the specimen and is deposited on the surface thereof, resulting in a reaction according to a following Reaction Formula 2.

$$SiC + O_2 \rightarrow SiC\text{---}Si + CO_2$$    Reaction Formula 2

That is, one carbon atom of silicon carbide is bonded to an oxygen atom and is separated from the silicon carbide via weak collision occurring such that sputtering by inert gas ions (Ar ions) does not occur. That is, one atomic layer is removed.

The inert gas ion is preferably sprayed using a plasma beam. In addition, controlling an irradiation diameter of the plasma beam may lead to controlling an irradiation amount of the beam, thereby to control a polishing range of the polishing target point. In particular, the plasma beam may be controlled in various ways, and various plasma beams may be applied.

The polishing system includes the gas supply connected to the sprayer for supplying the gas to the sprayer. When the number of types of the reactive gases is plural, it is preferable to provide a plurality of gas supplies as well.

Further, the polishing system includes the inert gas ion supply connected to the sprayer for supplying the inert gas ions to the sprayer. When the number of types the inert gas ions is plural, a plurality of the inert gas ion supplies is preferably provided.

The polishing system includes the pump 50. The pump 50 sucks the gas inside the chamber and exhausts the gas to the outside to maintain the interior of the chamber in a vacuum state. As described above, the pump sucks various gases generated during polishing of the specimen and exhausts the internal gases through an outlet connected to the outside.

The polishing system may precisely analyze the polishing target point and may polish precisely the specimen based on the analysis. Further, when there are a plurality of polishing target points, a first polishing target point thereof may be polished, then the sprayer may be moved, and then a second polishing target point may be polished, and so on. In this way, the plurality of polishing target points may be sequentially polished.

Although the present disclosure has been described above with reference to the preferred embodiments, those skilled in the art will appreciate that various modifications and changes may be made in the present disclosure without departing from the spirit and scope of the present disclosure set forth in the claims below.

Example 1

S1) A 4H—SiC wafer (4" diameter, 350 μm thickness, off 4°) made of silicon carbide was prepared as the silicon carbide specimen, and was placed in the chamber, and the chamber was evacuated at 200 mTorr.

S2) Thereafter, oxygen was first injected into the specimen surface for 15 seconds, and then the chamber was evacuated for 30 seconds so that only the oxygen-carbon reactive gas layer remained on the specimen surface.

S3) Then, Ar ions were then injected into the oxygen-carbon reactive gas layer for 15 seconds using 200 W Ar plasma.

S4) Thereafter, hydrogen plasma was injected thereto to remove a remaining oxygen-carbon reactive gas layer, and then, for 30 seconds, purging (0 m Torr) process was performed.

S5) Thereafter, $CF_4$ gas was injected onto the specimen surface for 15 seconds, and then, the chamber was evacuated for 60 seconds so that only a fluorine-silicon reaction gas layer remained on the specimen surface.

S6) Then, Ar ions were injected onto the fluorine-silicon reactive gas layer for 15 seconds using Ar plasma of 200 W.

S7) Thereafter, hydrogen plasma was injected thereto to remove a remaining fluorine-silicon reactive gas layer, and then a purging (0 m Torr) process was performed for 30 seconds.

S2) to S7) were repeated 100 times. A resulting surface was measured using an atomic force microscope to identify a surface roughness. A measurement result is shown in FIG. 5. FIG. 5 shows that the roughness of the local surface may be increased. This is because when the oxygen process is first performed, the specimen may be locally thickened as it is oxidized, and the roughness is increased at an atomic level.

Example 2

S1) A 4H—SiC wafer (4" diameter, 350 μm thickness, off 4°) made of silicon carbide was prepared as the silicon carbide specimen, and was placed in the chamber, and the chamber was evacuated at 200 mTorr.

S2) Thereafter, $CF_4$ gas was first injected into the specimen surface for 15 seconds, and then the chamber was evacuated for 30 seconds so that only the fluorine-silicon reactive gas layer remained on the specimen surface.

S3) Then, Ar ions were injected into the fluorine-silicon reactive gas layer for 15 seconds using Ar plasma of 200 W.

S4) Then, the hydrogen plasma was injected thereto to remove the remaining oxygen-carbon reactive gas layer, and then, for 30 seconds, a purging (0 m Torr) process was performed.

S5) Thereafter, oxygen gas was injected onto the specimen surface for 15 seconds, and then the chamber was evacuated for 60 seconds, thus leaving only the oxygen-carbon reactive gas layer on the specimen surface.

S6) Then, Ar ions were injected into the oxygen-carbon reactive gas layer for 15 seconds using Ar plasma of 200 W.

S7) Then, the hydrogen plasma was injected thereto to remove the remaining oxygen-carbon reactive gas layer, and, then, for 30 seconds, a purging (0 m Torr process) was carried out.

S2) to S7) were repeated 100 times. A resulting surface was measured using an atomic force microscope to identify the surface roughness. The measurement result is shown in FIG. 6. The surface roughness of the local portion of the specimen exhibits no change. When changing the gas condition, the surface roughness was increased at a small amount. The specimen was etched by about 0.6 nm per one cycle. This is thought to be due to sputtering by Ar plasma.

Example 3

While the plasma energy in Example 2 was lowered as follows to prevent the sputtering, the etching of a SiC atomic layer was carried out.

S1) A 4H—SiC wafer (4" diameter, 350 μm thickness, off 4°) made of silicon carbide was prepared as the silicon carbide specimen, and was placed in the chamber, and the chamber was evacuated at 200 mTorr.

S2) Thereafter, $CF_4$ gas was first injected into the specimen surface for 15 seconds, and then the chamber was evacuated for 30 seconds so that only the fluorine-silicon reactive gas layer remained on the specimen surface.

S3) Then, Ar ions were injected into the fluorine-silicon reactive gas layer for 15 seconds using Ar plasma of 150 W.

S4) Then, the hydrogen plasma was injected thereto to remove the remaining oxygen-carbon reactive gas layer, and then, for 30 seconds, a purging (0 m Torr) process was performed.

S5) Thereafter, oxygen gas was injected onto the specimen surface for 15 seconds, and then the chamber was evacuated for 60 seconds, thus leaving only the oxygen-carbon reactive gas layer on the specimen surface.

S6) Then, Ar ions were injected into the oxygen-carbon reactive gas layer for 15 seconds using Ar plasma of 150 W.

S7) Then, the hydrogen plasma was injected thereto to remove the remaining oxygen-carbon reactive gas layer, and, then, for 30 seconds, a purging (0 m Torr process) was carried out.

S2) to S7) were repeated 100 times. A resulting surface was measured using an atomic force microscope to identify the surface roughness. The measurement result is shown in FIG. 7. The surface roughness did not increase at the lowered plasma energy 150 W but the etching rate was 0.6 nm per one cycle.

The etching was performed 100 times at lowered plasma energy 100 W. A resulting surface was measured using an atomic force microscope to identify the surface roughness. The measurement result is shown in FIG. 9. The etching rate was 0.3 nm per one cycle. Further, while adjusting the plasma power to 200 W, 150 W and 100 W, the etching was carried out. In this case, the etch rate per ALE cycle is shown in FIG. 10. When the plasma power is increased, the sputtering effect by the inert particles occurs, resulting in a higher etching rate than an expected etching rate at an atomic level.

What is claimed is:

1. An atomic layer polishing method comprising:
    scanning a surface of a specimen to determine a peak position of the specimen surface;
    removing a first atomic layer from the surface of the specimen, wherein removal of the first atomic layer comprises:
        spraying a first reactive gas toward the determined peak position such that a first reactive gas layer is formed in a surface of the peak, wherein the first reactive gas is capable of bonding to a first atom as a component of the specimen, wherein the first reactive gas bonds to the first atom to form the first reactive gas layer;
        applying energy to the peak position where the first reactive gas layer is deposited, thereby separating the first atom bonded to the first reactive gas from the specimen;
    removing a second atomic layer from the surface of the specimen, wherein removal of the second atomic layer comprises:
        spraying a second reactive gas toward the determined peak position such that a second reactive gas layer is formed in a surface of the peak, wherein the second reactive gas is capable of bonding to a second atom as a component of the specimen, wherein the second reactive gas bonds to the second atom to form the second reactive gas layer, wherein the second reactive gas has a higher bonding ability to the second atom than to other atoms than the second atom; and
        applying energy to the peak position where the second reactive gas layer is deposited, thereby separating the second atom bonded to the second reactive gas from the specimen,
    wherein the first and second atoms are different.

2. The method of claim 1, wherein the method further comprises repeating separation of the second atom from the first reactive gas layer to increase a smoothness of the surface of the specimen.

3. The method of claim 1, wherein the method further comprises,
    between separating the first atom and forming the second reactive gas layer, removing the first reactive gas layer remaining on the specimen.

4. The method of claim 2, wherein the method further comprises:
    between separating the first atom and forming the second reactive gas layer, removing the first reactive gas layer remaining on the specimen; and
    between separating the second atom and forming the first reactive gas layer, removing the second reactive gas layer remaining on the specimen.

5. The method of claim 3, wherein removing the first and/or second reactive gas layer includes irradiating plasma of a gas capable of reacting with the first and/or second reactive gas.

6. The method of claim 1, wherein the first and second reactive gases bond to the first and second atoms, respectively to form a volatile gas.

7. The method of claim 1, wherein applying the energy includes irradiating ions of an inert gas.

8. The method of claim 7, wherein the irradiation of the ions of the inert gas is carried out at an energy level controlled such that sputtering does not occur.

9. The method of claim 8, wherein the energy level is in a range of 1 to 100 eV.

10. The method of claim 7, wherein the inert gas is selected from argon, helium and xenon.

11. The method of claim 1, wherein applying the energy includes irradiating electrons.

12. The method of claim 1, wherein applying the energy includes irradiating light energy.

13. The method of claim 1, wherein applying the energy includes irradiating neutral particles of an inert gas.

14. The method of claim 1, wherein the method further comprises, after the formation of the first and/or second reactive gas layer, exhausting the chamber such that only the first and/or second reactive gas bonded to the first and/or second atoms of the specimen respectively remains.

15. A silicon carbide planarization method using the atomic layer polishing method of claim 1, wherein the specimen is made of silicon carbide, wherein the first reactive gas contains fluorine, wherein the second reactive gas contains oxygen.

16. The silicon carbide planarization method of claim 15, wherein the first reactive gas containing fluorine is first sprayed, and, then, the second reactive gas containing oxygen is sprayed.

* * * * *